United States Patent
Likharev

[11] Patent Number: 6,121,654
[45] Date of Patent: *Sep. 19, 2000

[54] MEMORY DEVICE HAVING A CRESTED TUNNEL BARRIER

[75] Inventor: Konstantin K. Likharev, Port Jefferson Station, N.Y.

[73] Assignee: The Research Foundation of State University of New York, Stony Brook, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/949,217

[22] Filed: Oct. 10, 1997

[51] Int. Cl.[7] ............ H01L 29/288; H01L 29/292; H01L 21/336
[52] U.S. Cl. ............ 257/315; 257/324; 438/263; 438/264
[58] Field of Search ............ 257/315, 324, 257/325; 438/263, 264

[56] References Cited

U.S. PATENT DOCUMENTS

| | | | |
|---|---|---|---|
| 3,945,031 | 3/1976 | Kahng et al. | 257/325 |
| 4,257,832 | 3/1981 | Schwabe et al. | 438/275 |
| 5,101,249 | 3/1992 | Hijiya et al. | 257/325 |
| 5,640,345 | 6/1997 | Okuda et al. | 365/184 |
| 5,783,475 | 7/1998 | Ramaswami | 438/303 |

OTHER PUBLICATIONS

DiMaria, D.J., "Graded or stepped energy band–gap–insulator MIS structure (GI–MIS or SI–MIS)", J. Appl. Phys., Vo. 50, No. 9, pp. 5826–5829, Sep. 1979.

*Primary Examiner*—Donald L. Monin, Jr.
*Assistant Examiner*—Howard Weiss
*Attorney, Agent, or Firm*—Baker Botts LLP

[57] ABSTRACT

A nonvolatile, high-speed, bit-addressable memory device is disclosed. A tunnel barrier layer is disposed between a charge supply medium and a charge storage medium, with the tunnel barrier layer having a crested energy profile with a maximum half-way between the charge storage layer and the charge supply layer.

14 Claims, 6 Drawing Sheets

MEMORY DEVICE HAVING A CRESTED TUNNEL BARRIER

TECHNICAL FIELD

This invention relates to memory devices and, more particularly, to memory devices for digital data storage.

BACKGROUND OF THE INVENTION

As key components in digital computing and communications equipment, memory devices have been categorized as follows:

- static random access memories (SRAM) are fastest (having cycle times in nanoseconds), at the expense of taking up more chip area and requiring more power than other types;
- dynamic random-access memories (DRAM) may be very dense (1 Gigabit chips are in development), they are fast (cycle times in tens of nanoseconds), but they are "volatile" and need to be periodically refreshed, as well as a permanent power supply to keep stored data;
- electrically erasable programmable read only memories (EEPROM) are "nonvolatile" in that they can store data without power supply for long periods of time such as a year or more, but writing data into such memories is slow (requiring microseconds).

SUMMARY OF THE INVENTION

A novel nonvolatile memory device has high speed and bit addressability, and can be integrated at very high bit densities. The device includes a crested tunnel barrier, having an energy profile with a maximum between a charge storage medium and a charge supply medium.

BRIEF DESCRIPTION OF THE DRAWING

FIG. 1b is a side-view schematic of the cell of FIG. 1a.

DETAILED DESCRIPTION

Figure 1A:
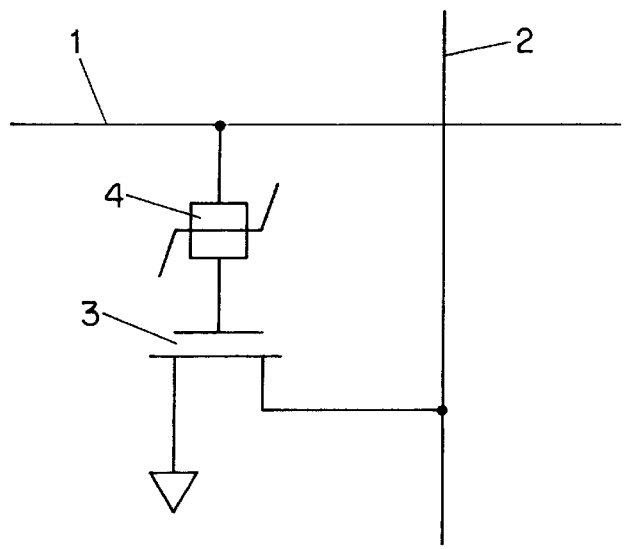
FIG. 1a is a circuit diagram for a one-bit cell of a bit-addressable, nonvolatile memory of EEPROM type.
Figure 1B:
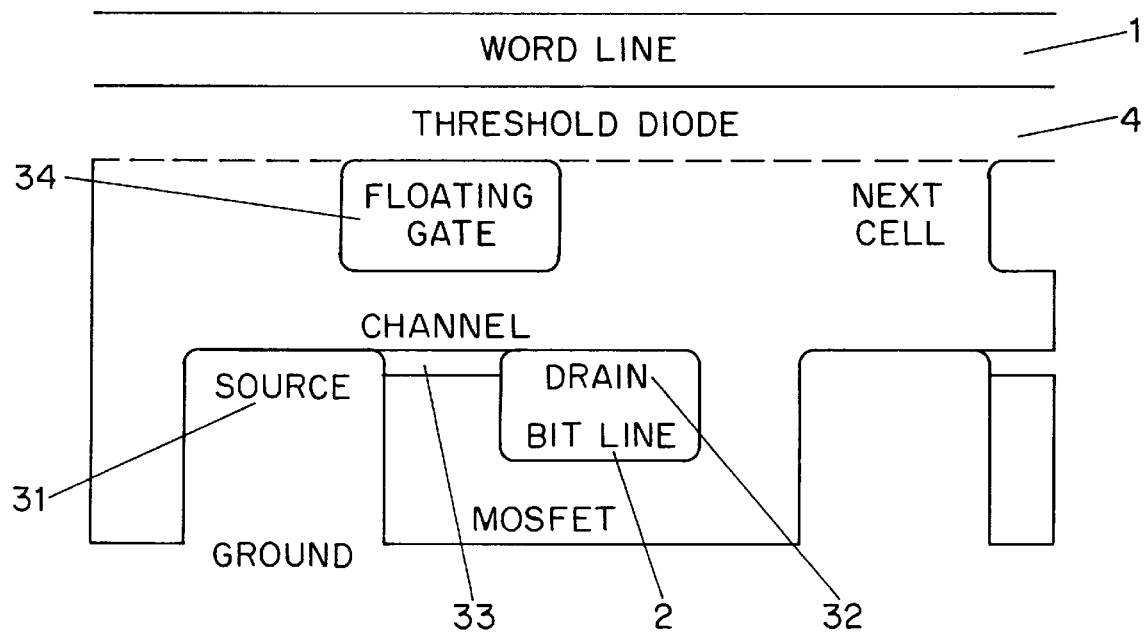

FIG. 1a shows a word line 1 and a bit line 2 from a memory driver circuit (not shown). The bit line 2 is connected to the drain of a metal-oxide-semiconductor field effect transistor (MOSFET) 3, and a threshold diode 4 is connected between the word line 1 and the floating gate of the MOSFET 3. Further to the features shown in FIG. 1a, FIG. 1b more specifically shows the source 31, the drain 32, the channel 33 and the floating gate 34 of the MOSFET 3. Generically in a memory cell according to FIGS. 1a and 1b, a data bit is stored in the form of an electric charge Q of the floating gate of the MOSFET. The threshold diode has a sharp threshold value $V_t$ in its I–V curve. If the voltage V across the threshold diode is less than $V_t$, the current I through it is negligible, so that the charge Q remains essentially constant, corresponding to the storage mode of the cell. The charge state of the cell can be read out non-destructively by its electrostatic effect on the channel of the MOSFET, which is galvanically insulated from the floating gate by a thick silicon oxide layer, for example. If the voltage V is raised above $V_t$, the threshold element "opens", allowing a substantial current I to flow into the gate and recharge it.

For acceptable switching, the I–V curve should satisfy a "sharpness condition" which may be derived from the second Kirchhoff's law applied to the memory cell:

$$dQ/dt = I = f(V_w - V_b - Q/C) \quad (1)$$

where C is the total capacitance of the gate, $V_w$ is the voltage applied to the word line, and $V_b$ is the effective maximum voltage applied to the gate via the MOSFET channel. $V_b$ is proportional to the voltage applied to the bit line, with the proportionality factor depending on the ratio of the floating gate capacitances to the channel and to the word line.

If $Q_0$ denotes the nominal charge of the gate, with $Q=+Q_0$ encoding binary unity and $Q=-Q_0$ encoding binary zero, the following three conditions are desirable:

(a) In the storage mode, when $V_w = V_b = 0$ and $V = \pm Q_0/C$, the current I should be so low that the recharging time scale $$\tau(V) = C \cdot V/I(V) \quad (2)$$

is greater than the minimal storage or "retention" time $\tau_r$ which should be at least 1 year ($\sim 3 \cdot 10^7$ s).

(b) In the write mode, when a signal of a certain amplitude $V_0$ is applied to both lines in anti-phase (with $V_w = -V_b = V_0$, say, for the initially stored charge $Q=+Q_0$), the current I has to be so high that the floating gate recharges (to the opposite and at least equal value) faster than a certain maximum write time $\tau_w$ which should be in the nanosecond range ($\tau_w \sim 10^{-8}$ s).

(c) When a certain cell is write-selected, any other cell attached to the same word and bit lines, but not to both of them, should not change its state. This requires $\tau > \tau_r$ in this "half-select" mode, i.e. for all combinations of the type $V_w = V_0$, $V_b = 0$, $Q = \pm Q_0$.

These conditions will be satisfied only if there exists a value $V_0$ such that $$\tau(V_0) \geq \tau_r \text{ and } \tau(2V_0) \leq \tau_w \quad (3)$$

i.e. the current I should change by more than 17 orders of magnitude when the voltage increases by a mere factor of 2.

Figure 2A:
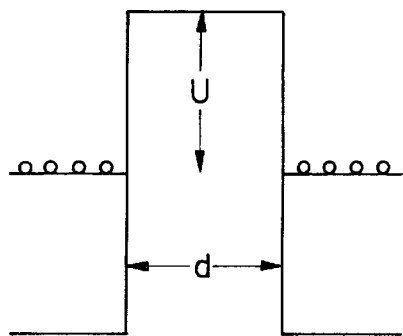
FIG. 2a is an energy band edge diagram of a prior-art tunnel barrier, having a rectangular energy profile.
Figure 5:
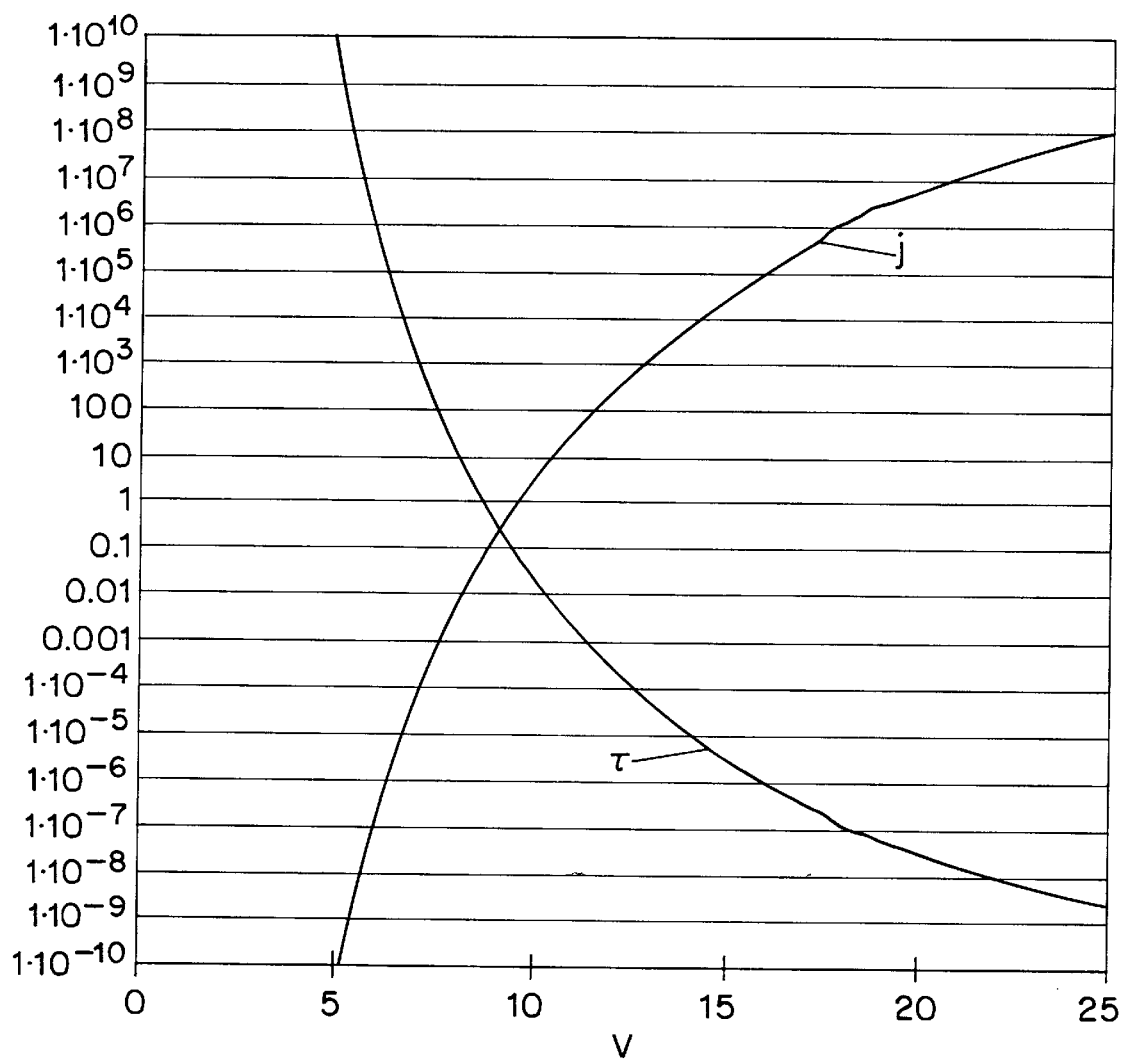
FIG. 5 is a graphic representation of current density and recharging time as a function of voltage across a barrier according to FIGS. 2a and 2b.

Prior-art diode layers, e.g. of $SiO_2$ fail to satisfy this condition. Such layers have a rectangular barrier profile as illustrated by FIG. 2a. Correspondingly, FIG. 5 shows the current density j (in A/m$^2$) through an initially rectangular, 5-nanometer-thick barrier of an insulator with U=3.6 eV, dielectric constant $\epsilon$=8.5 and effective electron mass m=0.48 m$_0$, sandwiched between two n$^+$-Si electrodes in which carrier mass is m=0.2 m$_0$. The independent variable is voltage V (in volts) applied to the barrier. Shown also is the corresponding floating-gate recharging time $\tau$(V) (in seconds) as determined by Equation 2. These functional relationships have been obtained by calculations based on quasi classical approximation, assuming parabolic dispersion of electrons in the conduction band and taking account of the image charge effects.

FIG. 5 shows that the largest V$_0$ which still provides one-year retention is close to 6.6 V, so that the shortest write time is $\tau$(2V$_0$)=$\tau$(13.2 V)~3 ms. This is too long for RAM applications. Any change of the barrier thickness to either side of 5 nm actually worsens the time ratio. If the parameters are changed to those of SiO$_2$ (with U=3.2 V and m=0.48 m$_0$), the optimal barrier thickness becomes d~9 nm and the one-year retention time is compatible with a write time of ~100 $\mu$s, which is not fast enough for bit-addressable memories.

In accordance with an aspect of the invention, memory performance is enhanced by using "crested" barriers, with the potential barrier height peaking in the middle and decreasing toward the interfaces with the electrodes.

Figure 2B:
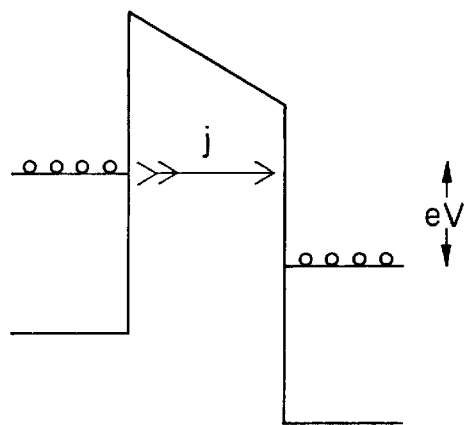
FIG. 2b is an energy band edge diagram as in FIG. 2a, but with a voltage applied across the barrier.
Figure 3A:
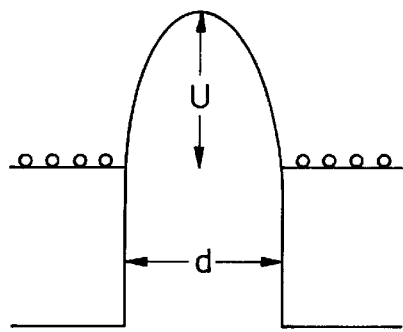
FIG. 3a is an energy band edge diagram of one tunnel barrier in accordance with the invention, having a parabolic energy profile.
Figure 3B:
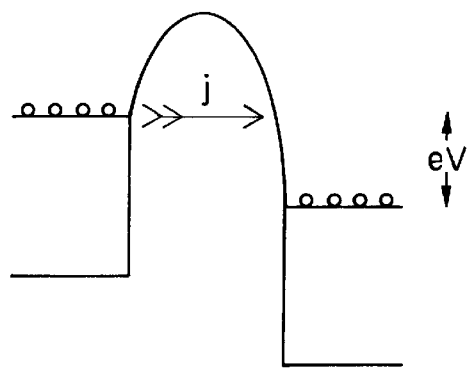
FIG. 3b is an energy band edge diagram as in FIG. 3a, but with a voltage applied across the barrier.
Figure 6:
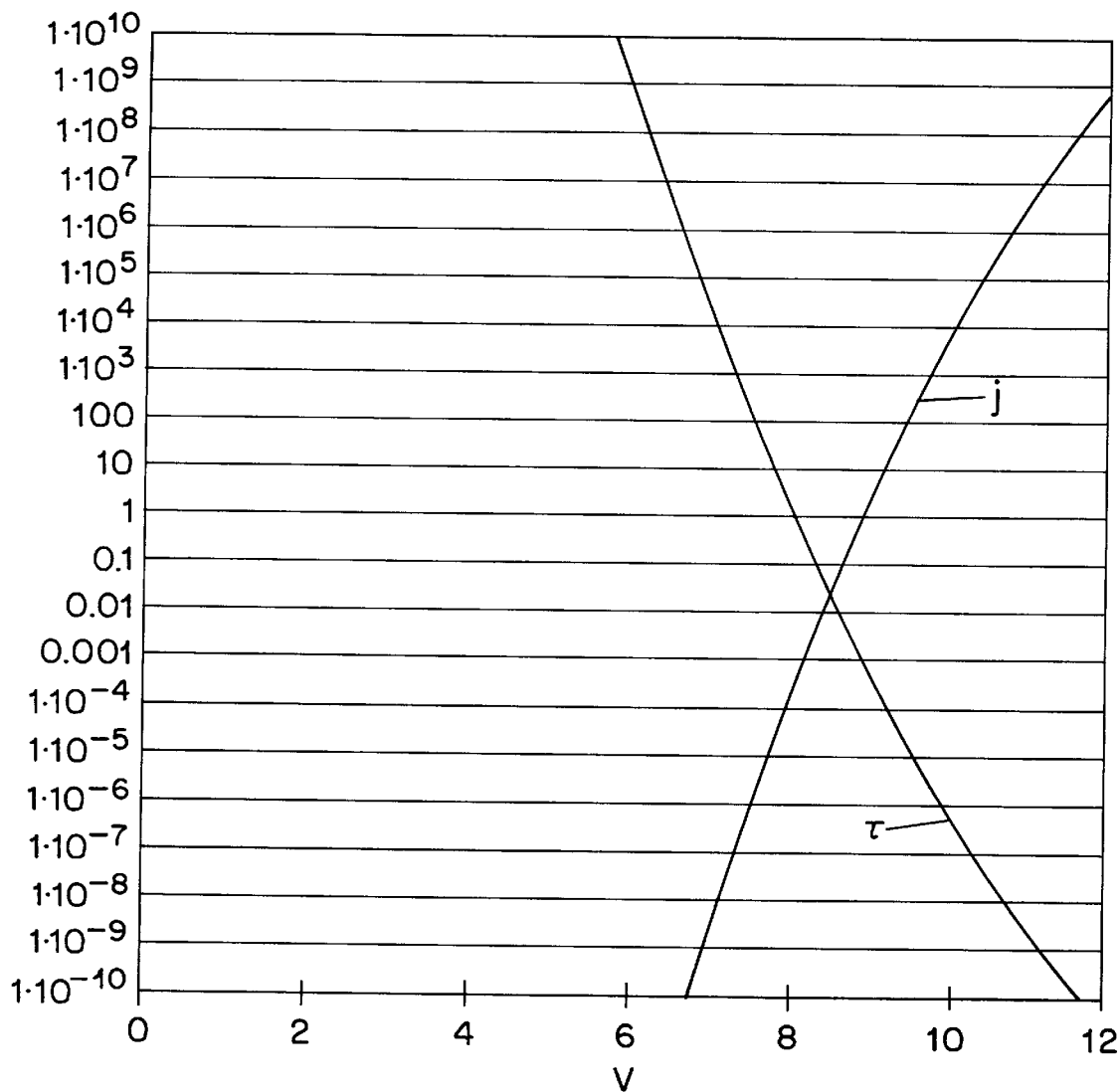
FIG. 6 is a graphic representation of current density and recharging time as a function of voltage across a barrier according to FIGS. 3a and 3b.

FIG. 6 shows curves as in FIG. 5, but under the assumption that the potential profile of the barrier is described by the quadratic parabola $$U(x)=4\ U(x/d)(1-x/d) \tag{4}$$

where x is the distance from the electron emitter (in FIG. 3a the left boundary of the barrier). As compared with FIG. 5, FIG. 6 shows that the current changes much faster with this barrier. For example, assuming V$_0$=6.3 V, the retention time is $\tau_r$=$\tau$(V$_0$)~1 year, and the write time is $\tau_w$=$\tau$(2V$_0$)<1 ns. The improvement can be attributed to the applied electric field E=V/d always pulling the potential profile down linearly in x:

$$U(x)|_{E\neq 0}=U(x)|_{E=0}-Ex \tag{5}$$

whereas, in the case of a rectangular barrier, the highest part of the barrier, close to the left interface, is left virtually intact as illustrated by FIG. 2b. Since it is the highest part which most affects the barrier transparence and hence the current, the field effect is relatively small. On the other hand, in the parabolic barrier the highest part of the barrier, in the middle, is pulled down strongly as illustrated by FIG. 3b, providing for increased barrier transparence and tunnel current.

Parabolic barriers may be made by interleaving a uniform layer of a wideband semiconductor with several thin, highly p-doped layers. Ionization of the dopants leads to negative electric charging of each layer, and hence to quasi-uniform charging of the whole layer. According to the Poisson equation, such uniform charging results in parabolic bending of the conduction band edge, similar to that described by Equation 4, with the barrier height U being proportional to the total number of dopants. But, for most prospective wideband materials, e.g. SiO$_2$ or AlN, suitable dopants with shallow levels have yet to be found.

Figure 4A:
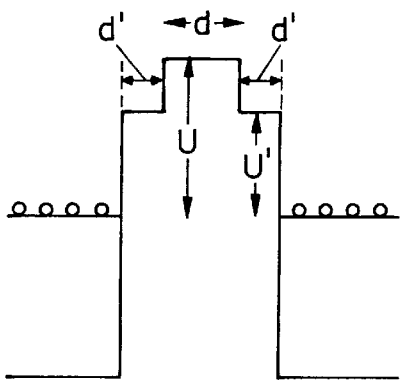
FIG. 4a is an energy band edge diagram of another tunnel barrier in accordance with the invention, having a stepped energy profile.
Figure 7:
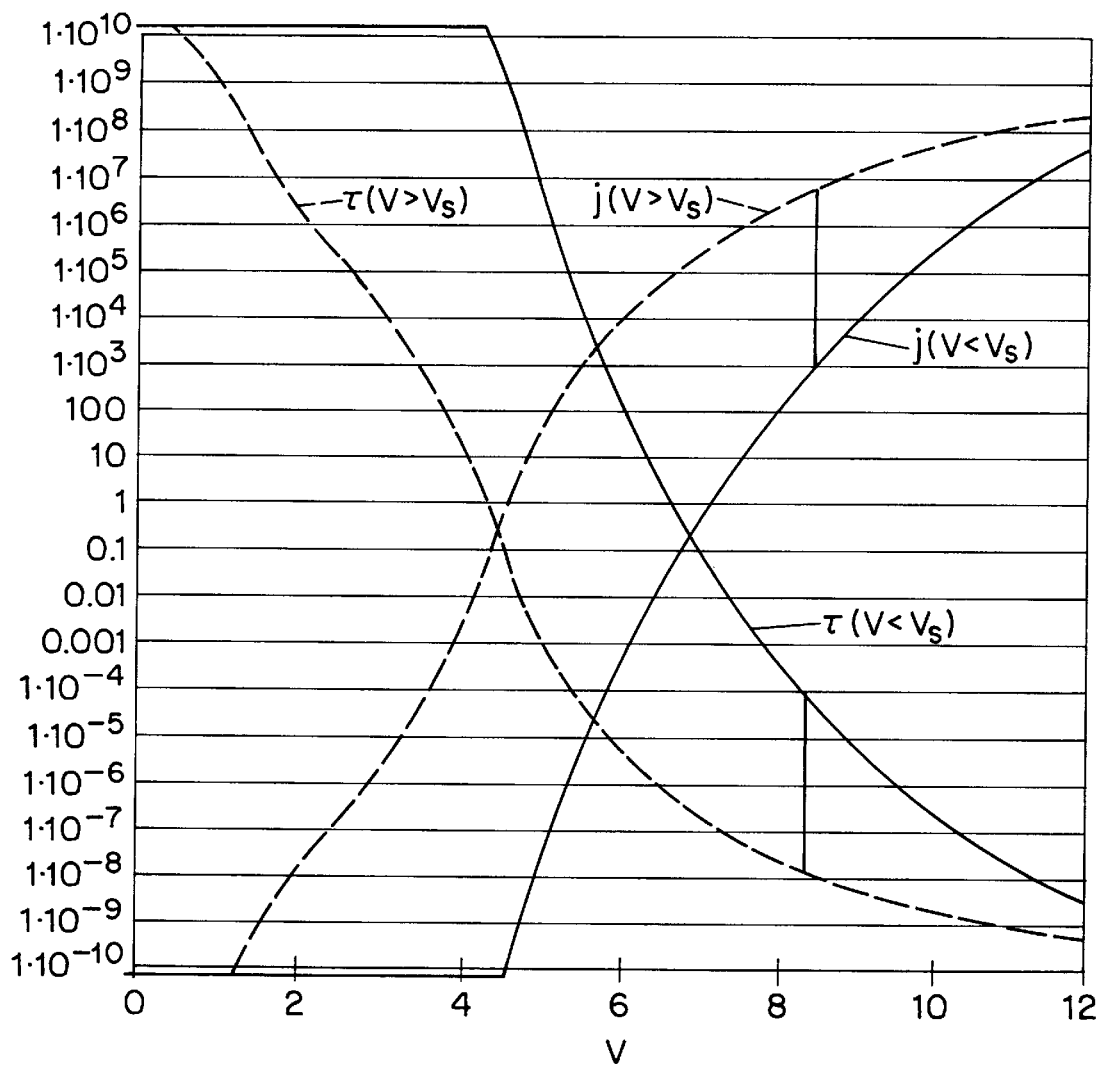
FIG. 7 is a graphic representation of current density and recharging time as a function of voltage across a barrier according to FIGS. 4a and 4b.

Alternatively, the parabolic shape of FIG. 3a can be approximated by a staircase pattern formed by interleaving a few (three, say) layers of different materials as illustrated by FIG. 4a. FIG. 7 shows the results of calculations of the electron transport through such a barrier. The I–V curve is almost as sharp as that of the parabolic barrier, and the one-year retention time is compatible with ~2 ns write time.

Layered barriers are advantageous further in that, as soon as the applied voltage exceeds some value V$_S$ when the potential well at the layer interface (FIG. 4b) is pulled down below the Fermi level of the electron emitter, the barrier is effectively divided into two sequential barriers separated by an electron layer formed at the well bottom, with a "floating" electric potential which should be determined from the condition of the layer charge conservation. Due to sequential tunneling of electrons through each of the sub-barriers, the transparence of such a composite barrier typically is considerably higher than that of the solid barrier, so that, at V=V$_S$, the current rises sharply and the recharging time drops.

With reference to FIG. 7, materials for the crested barrier should satisfy the following conditions: proper hierarchy of the barrier heights, namely 0<U'<U; proper hierarchy of the electron masses, namely m'<m if possible; and technological compatibility. These conditions are satisfied, e.g., for the trilayer barrier system n$^+$-Si/Si$_3$N$_4$/AlN/Si$_3$N$_4$/n$^+$-Si to which FIG. 7 corresponds. Well-known techniques such as chemical vapor deposition (CVD) can be used for forming this and other suitable barrier systems.

As described, memories of the invention combine attractive features of DRAMs with nonvolatility. Moreover, with memory cells scaled down to ~5-nanometer feature size and a corresponding density of ~10$^{11}$ bits/cm$^2$, a memory unit may hold 1 terabit especially in view of the fact that such a unit, unlike a conventional DRAM, does not require a bit storage capacitor. At a 5-nanometer feature size, the MOSFETs may be replaced by room-temperature single-electron transistors which may permit yet further scale-down, to ~1-nanometer feature size.

Figure 8:
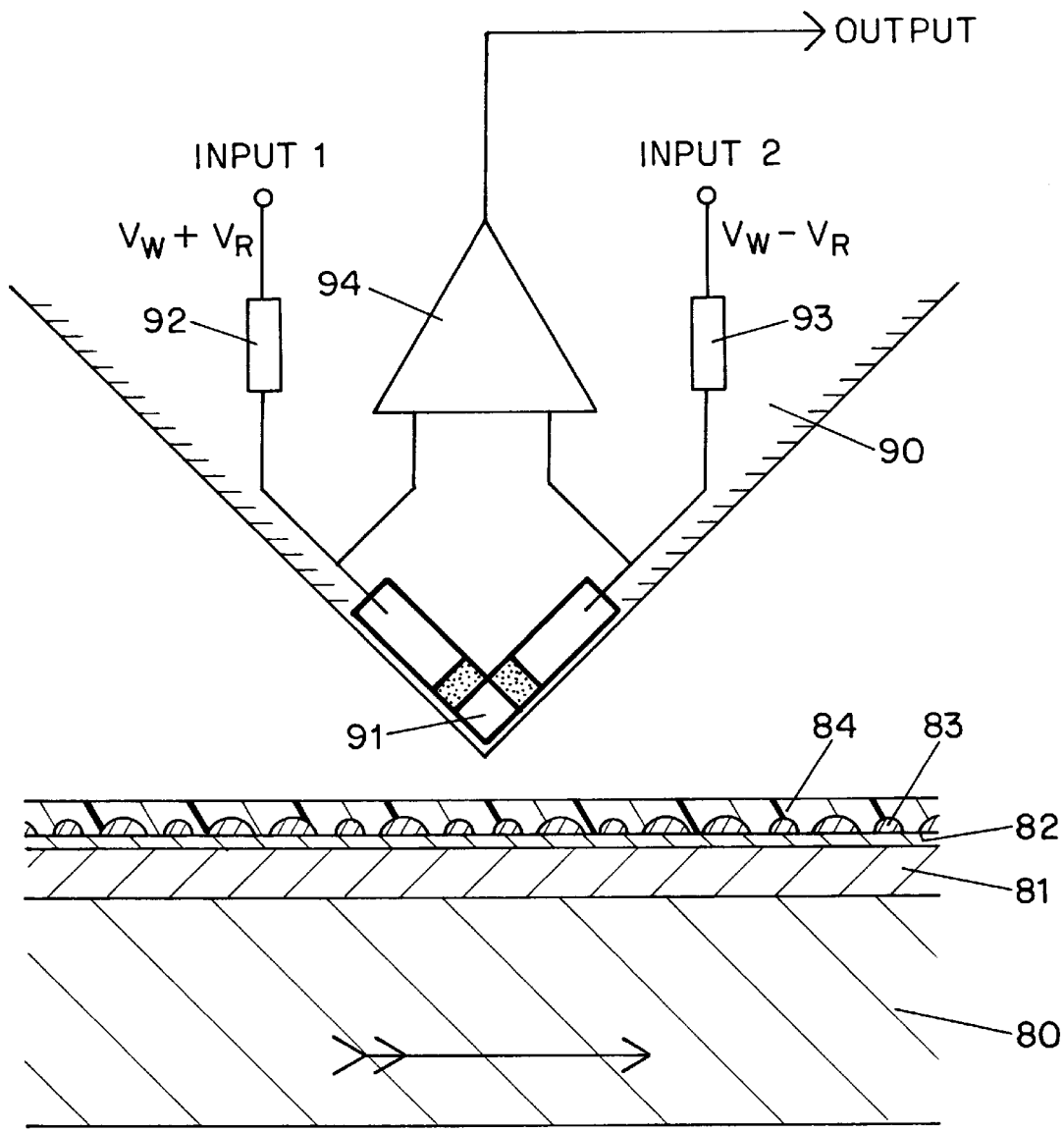
FIG. 8 is a schematic of electrostatic recording using a storage medium in accordance with a further embodiment of the invention.

Further to the embodiments described above, a memory or data storage unit in accordance with the invention may take the form of a recording medium as shown in FIG. 8. A read/write head 90 is flown over a medium such as a recording tape or disc including a substrate 80, a charge supply (ground) layer 81, a crested tunnel barrier layer 82, nanometer-size metallic grains 83 which need not be of similar size, and a protective layer 84 of a plastic material, for example. The grains 83 can be formed readily by resistive evaporation of a suitable metal in vacuum, e.g. aluminum. A digital bit is coded by the electrostatic charging of a small group of grains.

Figure 4B:
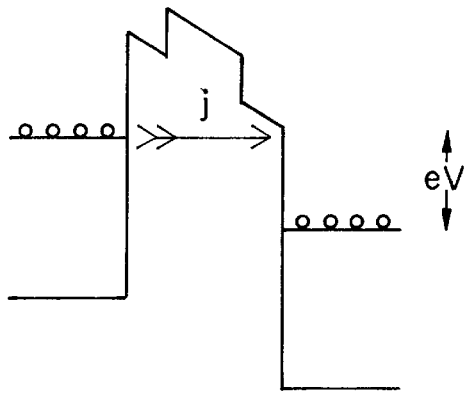
FIG. 4b is an energy band edge diagram as in FIG. 4a, but with a voltage applied across the barrier.

Recording is achieved by the application of a suitable (positive or negative) voltage V$_w$ to the loads 92 and 93 in read/write head 90. If the voltage is high, the tunneling barrier is lowered in layer 82, as illustrated by FIGS. 3b and 4b, for example, and electrons are pulled from the ground electrode 81 into the grains 83. If the voltage is negative, electrons are pushed out of the grains. The recorded information can be read out by application of the opposite voltages ±V$_r$ to the loads 92 and 93. This voltage biases the single-electron transistor (SET) 91 which is highly sensitive to the electric field which in this case is due to the charged groups of grains 83. The SET output signal is amplified further by a proximately disposed MOSFET 94 and then sent out.

It can be estimated that such electrostatic recording can provide data storage densities up to ~10$^{12}$ bits/cm$^2$, which is about two orders of magnitude greater than the prospective density achievable in magnetic recording, with an adequate write/read speed of the order of 1 Gigabit/s per channel.

I claim:

1. A floating gate memory device including a layered structure which comprises a charge supply region, a floating gate charge storage region, and a tunnel barrier region between the charge supply region and the charge storage region, wherein the tunnel barrier region has a potential energy profile which peaks between the charge supply region and the charge storage region, and which decreases towards the charge supply region and the charge storage region.

2. The memory device according to claim 1, wherein the tunnel barrier region has a stepped energy profile.

3. The memory device according to claim 2, wherein the tunnel barrier region consists of at least three layers.

4. The memory device according to claim 3, wherein the tunnel barrier region consists of $Si_3N_4$, AlN and $Si_3N_4$ layers in sequence.

5. A floating gate integrated circuit memory device including a plurality of cells, wherein each of the cells comprises:

a MOSFET which is operably coupled to a bit line and a potential source;

a floating gate conductor which is operably coupled via a tunnel barrier region to a word line; and wherein the tunnel barrier region has a potential energy profile which peaks between the floating gate conductor and the word line, and which decreases towards the floating gate conductor and the word line.

6. The memory device according to claim 5, wherein the tunnel barrier has a stepped energy profile.

7. The memory device according to claim 6, wherein the tunnel barrier consists of at least three layers.

8. The memory device according to claim 7, wherein the tunnel barrier region consists of $Si_3N_4$, AlN and $Si_3N_4$ layers in sequence.

9. A data storage medium including a substrate-supported layered structure which comprises a charge supply electrode, multiple charge storage floating conducting regions, and a tunnel barrier region between the charge supply electrode and the charge storage regions, wherein the tunnel barrier region has a potential energy profile which peaks between the charge supply electrode and the charge storage regions, and which decreases towards the charge supply electrode and the charge storage regions.

10. The data storage medium according to claim 9, wherein the tunnel barrier region has a stepped energy profile.

11. The data storage medium according to claim 10, wherein the tunnel barrier region consists of at least three layers.

12. The data storage medium according to claim 11, wherein the tunnel barrier region consists of $Si_3N_4$, AlN and $Si_3N_4$ layers in sequence.

13. The data storage medium according to claim 10, wherein the charge storage regions comprise a multiplicity of metallic grains of random size.

14. The data storage medium according to claim 9, further comprising a protective region on the charge supply region.

* * * * *

UNITED STATES PATENT AND TRADEMARK OFFICE
CERTIFICATE OF CORRECTION

| | |
|---|---|
| PATENT NO. | : 6,121,654 |
| DATED | : September 19, 2000 |
| INVENTOR(S) | : Likharev, Konstantin |

It is certified that error appears in the above-identified patent and that said Letters Patent is hereby corrected as shown below:

Column 1,
Line 4, insert -- This invention was made with government support under Department of the Navy, grant numbers N00014-93-1-0880 and N00014-96-1-0842. Therefore, the United States Government has certain rights in the invention. --.

Signed and Sealed this

Eighth Day of November, 2005

JON W. DUDAS
*Director of the United States Patent and Trademark Office*